United States Patent
Cheng et al.

(10) Patent No.: US 8,536,032 B2
(45) Date of Patent: Sep. 17, 2013

(54) FORMATION OF EMBEDDED STRESSOR THROUGH ION IMPLANTATION

(75) Inventors: Kangguo Cheng, Albany, NY (US); Bruce B. Doris, Brewster, NY (US); Ali Khakifirooz, Mountain View, CA (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 13/155,878

(22) Filed: Jun. 8, 2011

(65) Prior Publication Data

US 2012/0313168 A1    Dec. 13, 2012

(51) Int. Cl.
*H01L 21/265*    (2006.01)

(52) U.S. Cl.
USPC .............. 438/522; 438/166; 257/E21.634

(58) Field of Classification Search
USPC .. 438/164, 219, 296, 166, 522; 257/E21.634
See application file for complete search history.

(56) References Cited

U.S. PATENT DOCUMENTS

| | | | |
|---|---|---|---|
| 6,383,904 B1 * | 5/2002 | Yu ................................. | 438/589 |
| 6,391,695 B1 * | 5/2002 | Yu ................................. | 438/166 |
| 6,707,106 B1 | 3/2004 | Wristers et al. | |
| 6,774,015 B1 | 8/2004 | Cohen et al. | |
| 7,592,619 B2 * | 9/2009 | Tsai et al. ........................ | 257/19 |
| 7,615,829 B2 * | 11/2009 | Lochtefeld et al. ............ | 257/377 |
| 7,659,213 B2 | 2/2010 | Wei et al. | |
| 7,704,839 B2 | 4/2010 | Ieong et al. | |
| 7,871,877 B2 | 1/2011 | Griebenow et al. | |
| 2003/0027381 A1 * | 2/2003 | Buynoski et al. ............. | 438/162 |
| 2005/0112811 A1 * | 5/2005 | Hsu et al. ...................... | 438/197 |
| 2007/0290264 A1 * | 12/2007 | Sugii et al. .................... | 257/348 |
| 2008/0220594 A1 * | 9/2008 | Clavelier et al. .............. | 438/492 |
| 2009/0090933 A1 * | 4/2009 | Ninomiya et al. ............. | 257/190 |
| 2009/0194789 A1 | 8/2009 | Griebenow et al. | |
| 2009/0261412 A1 * | 10/2009 | Saito et al. .................... | 257/347 |
| 2010/0155898 A1 | 6/2010 | Maynard et al. | |
| 2013/0099314 A1 * | 4/2013 | Lu et al. ......................... | 257/347 |

FOREIGN PATENT DOCUMENTS

JP    2007335573    12/2007

* cited by examiner

*Primary Examiner* — Matthew Landau
*Assistant Examiner* — Joseph C Nicely
(74) *Attorney, Agent, or Firm* — Thomas Grzesik; Fleit Gibbons Gutman Bongini & Bianco PL

(57) ABSTRACT

An extremely-thin silicon-on-insulator transistor includes a buried oxide layer above a substrate. The buried oxide layer, for example, has a thickness that is less than 50 nm. A silicon layer is above the buried oxide layer. A gate stack is on the silicon layer includes at least a gate dielectric formed on the silicon layer and a gate conductor formed on the gate dielectric. A gate spacer has a first part on the silicon layer and a second part adjacent to the gate stack. A first raised source/drain region and a second raised source/drain region each have a first part that includes a portion of the silicon layer and a second part adjacent to the gate spacer. At least one embedded stressor is formed at least partially within the substrate that imparts a predetermined stress on a silicon channel region formed within the silicon layer.

9 Claims, 10 Drawing Sheets

US 8,536,032 B2

FORMATION OF EMBEDDED STRESSOR THROUGH ION IMPLANTATION

FIELD OF THE INVENTION

The present invention generally relates to the field of semiconductors, and more particularly relates to embedded stressors in field effect transistors.

BACKGROUND OF THE INVENTION

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device. With conventional planar FET scaling reaching fundamental limits, the semiconductor industry is looking at more unconventional geometries that will facilitate continued device performance improvements

SUMMARY OF THE INVENTION

In one embodiment, a method for fabricating an extremely-thin-silicon-on-insulator transistor is disclosed. The method comprises forming a buried oxide layer on a silicon substrate. A gate stack is formed on the silicon layer that is above the buried oxide layer. A gate spacer is formed on the silicon layer and on sidewalls of the gate stack. A first raised source/drain region and a second raised source/drain region are epitaxially formed adjacent to the gate spacer. At least one embedded stressor is formed at least partially within the substrate that imparts a predetermined stress on a silicon channel region formed within the silicon layer.

In another embodiment an extremely-thin silicon-on-insulator transistor is disclosed. The extremely-thin silicon-on-insulator transistor comprises a buried oxide layer above a substrate. The buried oxide layer, for example, has a thickness that is less than 50 nm. A silicon layer is above the buried oxide layer. A gate stack is on the silicon layer comprising at least a gate dielectric formed on the silicon layer and a gate conductor formed on the gate dielectric. A gate spacer has a first part on the silicon layer and a second part adjacent to the gate stack. A first raised source/drain region and a second raised source/drain region each have a first part comprising a portion of the silicon layer and a second part adjacent to the gate spacer. At least one embedded stressor is formed at least partially within the substrate that imparts a predetermined stress on a silicon channel region formed within the silicon layer.

In yet another embodiment an integrated comprising is disclosed. The integrated circuit comprises a circuit supporting substrate having an electrical circuit disposed thereon and an extremely-thin silicon-on-insulator transistor. The extremely-thin silicon-on-insulator transistor comprises a buried oxide layer above a substrate. The buried oxide layer, for example, has a thickness that is less than 50 nm. A silicon layer is above the buried oxide layer. A gate stack is on the silicon layer comprising at least a gate dielectric formed on the silicon layer and a gate conductor formed on the gate dielectric. A gate spacer has a first part on the silicon layer and a second part adjacent to the gate stack. A first raised source/drain region and a second raised source/drain region each have a first part comprising a portion of the silicon layer and a second part adjacent to the gate spacer. At least one embedded stressor is formed at least partially within the substrate that imparts a predetermined stress on a silicon channel region formed within the silicon layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Figure 1:
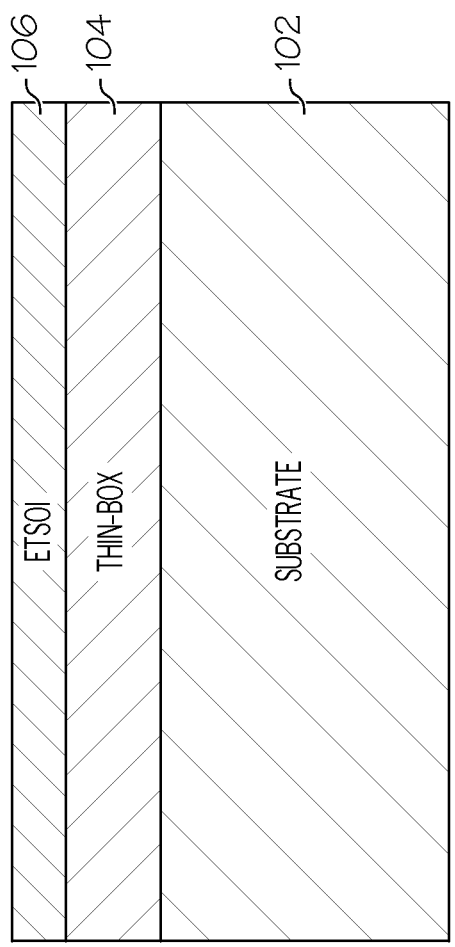
FIGS. 1 to 5 are cross-sectional views of a process for forming a transistor with embedded stressors using ion implantation according to one embodiment of the present invention.

FIGS. 1 to 8 illustrate various processes for forming embedded stressors for ultra-thin body and box (UTBB) devices according to various embodiments of the present invention. The process begins, for both an NFET and PFET device, with an SOI wafer that is formed by a silicon substrate 102, a buried oxide layer ("BOX") 104, and an extremely thin silicon-on-insulator (ETSOI) layer 106, as shown in FIG. 1. The BOX layer 104, in this embodiment, is a "thin" BOX layer having a thickness that is less than 50 nm, and in one embodiment, has a thickness ranging from 10 nm to 30 nm. Also, the ETSOI layer 106 has a thickness ranging from 1 nm to 20 nm, and in one embodiment, has a thickness ranging from 3 nm to 10 nm. Alternatively, the process can begin with a "thick" SOI wafer having a thickness in the 30-90 nm range, and thinning can be performed using oxidation and a hydrofluoric acid (HF) wet etch to reduce the thickness (e.g., down to the 3-10 nm range).

An active area 206 for the transistor is then defined within the ETSOI 106. In this embodiment, the active area comprises the ETSOI layer 106 and is defined through pad-film deposition, photolithography, and reactive-ion etching ("RIE"). In particular, a pad oxide (not shown), which has, for example, a thickness of 2-10 nm, is formed in a conventional oxidation furnace, and a pad nitride (not shown) is deposited over the pad oxide using low-pressure chemical vapor deposition ("LPCVD") or rapid-thermal chemical vapor deposition ("RTCVD"). Photolithography and a nitride-oxide-silicon RIE are then performed to define the active area.

Next, the active area 206 is isolated, such as through shallow trench isolation ("STI"). In this embodiment, STI is obtained through deposition of an STI oxide, densification anneals, and chemical-mechanical polishing ("CMP") that stops on the pad nitride. This forms an STI region 208 over the thin-BOX layer 104 that is continuous around the active area 206, as shown in FIG. 2.

The pad nitride, along with any STI oxide remaining on the pad nitride, and the pad oxide are then removed (e.g., through wet etching using hot phosphoric acid and HF). In an embodiment where well implants are to be created a sacrificial oxide layer is formed through oxidation to create a screening layer for the subsequent well implants and/or backgate implants. In this embodiment, the well implants and/or backgate implants are created using photolithography to selectively define NFET and PFET areas for the wells, and then ions are implanted to form the wells. A p-type well is formed by implanting p-type species (such as B, $BF_2$, or In), while an n-type well is formed by implanting n-type species (such as As, P, or Sb). In one embodiment, the energy of the implanted ions is selected to position their final distribution in the desired depth of the ETSOI layer 206 or the substrate 102. In one embodiment, the energy of the implanted ions for the well implant is selected such that the peak of their distribution is positioned inside the ETSOI layer 206. For the backgate implant, the energy of the implanted ions is selected to position the peak of their distribution in the substrate 102 and in the proximity (5-20 nm dissonance) of the interface between the substrate 102 and the thin buried oxide 104. An anneal is performed after well implantation to heal the damage to the ETSOI within the active area 206 due to ion implantation. Alternatively, well implantation is skipped to create a completely undoped device. The sacrificial oxide layer is then removed (e.g., using HF).

Most semiconductor integrated circuits include input/output (I/O) transistors that need a thick gate oxide to allow operation operate at higher voltages. However, high-speed transistors in the same integrated circuit are formed with thin gate oxide layers. To provide both types of transistors in the same integrated circuit, a thick gate oxide layer is first formed through deposition over the entire wafer. Then, the thick-oxide transistors are masked off using photolithography, and the thick gate oxide layer is removed (e.g., using an HF etch) from areas for the thin gate oxide transistors.

Figure 2:
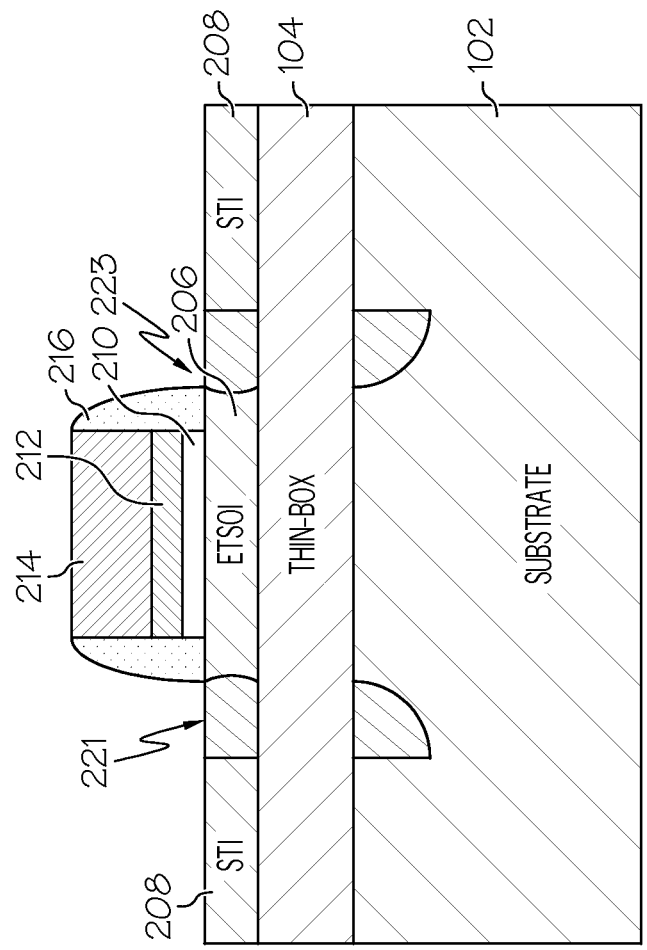

FIG. 2 also shows that a gate dielectric 210 and a gate conductor 212 have been formed on the active region 206. More specifically, a stack of a gate dielectric layer and a gate conductor layer are formed on the active region 206. This stack is then lithographically patterned and etched to form the gate dielectric 210 and the overlying gate conductor 212 in a portion of the active region 206.

The gate dielectric 210 of this embodiment comprises a conventional dielectric material (such as silicon oxide, silicon nitride, silicon oxynitride, or a stack thereof) that is formed by thermal conversion of a top portion of the active region 206 and/or by chemical vapor deposition ("CVD"). In alternative embodiments, the gate dielectric 210 comprises a high-k dielectric material (such as hafnium oxide, zirconium oxide, lanthanum oxide, aluminum oxide, titanium dioxide, strontium titanate, lanthanum aluminate, yttrium oxide, an alloy thereof, or a silicate thereof) that is formed in a known manner (such as by CVD, atomic layer deposition ("ALD"), molecular beam epitaxy ("MBE"), pulsed laser deposition ("PLD"), liquid source misted chemical deposition ("LSMCD"), or physical vapor deposition ("PVD")).

The gate conductor 212 comprises a semiconductor (e.g., polysilicon) gate layer and/or a metal gate layer. In one embodiment in which of the gate dielectric 210 comprises a conventional dielectric material, the gate conductor 212 is a semiconductor gate layer. In one embodiment in which the gate dielectric 210 comprises a high-k dielectric material, the gate conductor 212 is a metal gate layer abutting the gate dielectric 210 and comprising a conductive refractory metal nitride (such as TaN, TiN, WN, TiAlN, TaCN, or an alloy thereof). In another embodiment, the gate conductor 212 comprises a stack of a metal gate layer and a semiconductor gate layer. Also, a gate polysilicon cap 214 can be deposited on the gate conductor layer 212, such as through LPCVD or silicon sputtering.

The gate formation process discussed above can be referred to as a "gate-first" process. However, in another embodiment, a "gate-last" process is implemented where a "dummy" or "replacement" gate is formed using, for example, polysilicon instead of the gate dielectric 210 and gate conductor 212 layers during the gate formation process discussed above. This "dummy" or "replacement" gate acts as a place holder for the gate stack, which is subsequently formed after embedded stressor formation, as will be discussed below with respect to FIGS. 6-8.

FIG. 2 further shows that a gate spacer layer 216 comprising a dielectric material (such as silicon oxide, silicon nitride, silicon oxynitride or a combination of these) is formed on the gate stack 210, 212, 214 and on the active region 206. In one embodiment, a reactive-ion etch process is used to remove the dielectric material on horizontal surfaces such as the top of the gate stack, the STI regions 208, and the active region 206 to form a gate spacer only on the sidewall of the gate stack 210, 212, 214. However, the gate spacer layer 216 can be etched such that the gate spacer 216 also resides on top of the gate stack as well. Ion implantations are performed employing the gate stack 210, 212, 214 as an implantation mask in order to form a source extension region 221 and a drain extension region 223.

Figure 3:
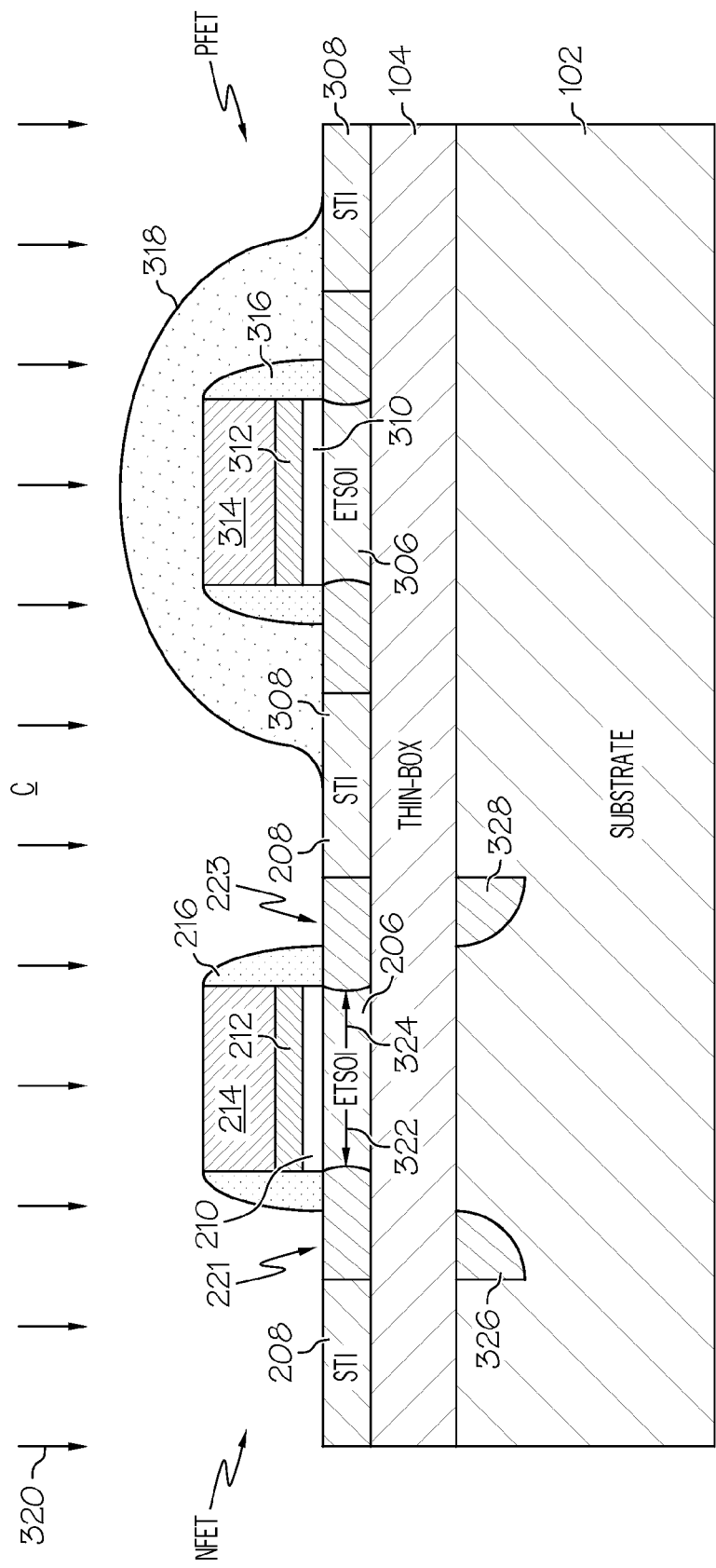

It should be noted that the above processes are performed for both NFET and PFET devices resulting in the structures shown in FIG. 3. FIG. 3 also shows that a mask 318 is formed over the gate stack 310, 312, 314, gate spacer 316, on top of the STI regions 308, and the active region 306 of the PFET device. The mask 318, in one embodiment, comprises a photoresist material such as polysilicon or nitride. A carbon implantation process (indicated by the arrows 320) is performed in order to form amorphized carbon implant regions either within the thin-BOX layer 104 extending into the substrate 102 or entirely within the substrate 102 of the NFET device. During this carbon implantation process, the PFET device is protected by the mask 318.

Next, an anneal process (e.g., a laser anneal, flash anneal, rapid thermal anneal, furnace anneal, etc.) is performed so as to re-crystallize the amorphized carbon implant regions. Upon re-crystallization, the substitutional carbon either present in the thin-BOX layer 104 extending down into the substrate later 102 or present entirely in the substrate layer 102 forms a silicon carbon alloy that imparts a predetermined stress (e.g., a tensile stress) on the silicon channel region as indicated by the arrows 322, 324. For example, FIG. 3 shows that silicon-carbon (Si:C) embedded stressors 326, 328 have been formed below the thin-BOX layer 104 in the substrate layer 102 of the NFET device. In this embodiment there is no appreciable carbon content in the active region of the device. These Si:C embedded stressors 326, 328 are formed below the source/drain regions 321, 323 of the NFET. In one embodiment, the energy of carbon ions used during the implantation process is between 5 keV and 20 keV and the dose is between $1\times10^{14}$ cm$^{-2}$ and $1\times10^{16}$ cm$^{-2}$. However, other energies and doses are applicable. This carbon implantation under the thin-BOX enhances electron mobility in the NFET. In one embodiment, the concentration of carbon atoms in the substitutional sites is greater than 0 and less than 2.5 percent. In another embodiment the carbon concentration in the substitutional sites is between 0.5% and 2%. The thin-BOX allows lower energy implants thereby minimizing the effect of channel poisoning and/or amorphization.

Figure 4:
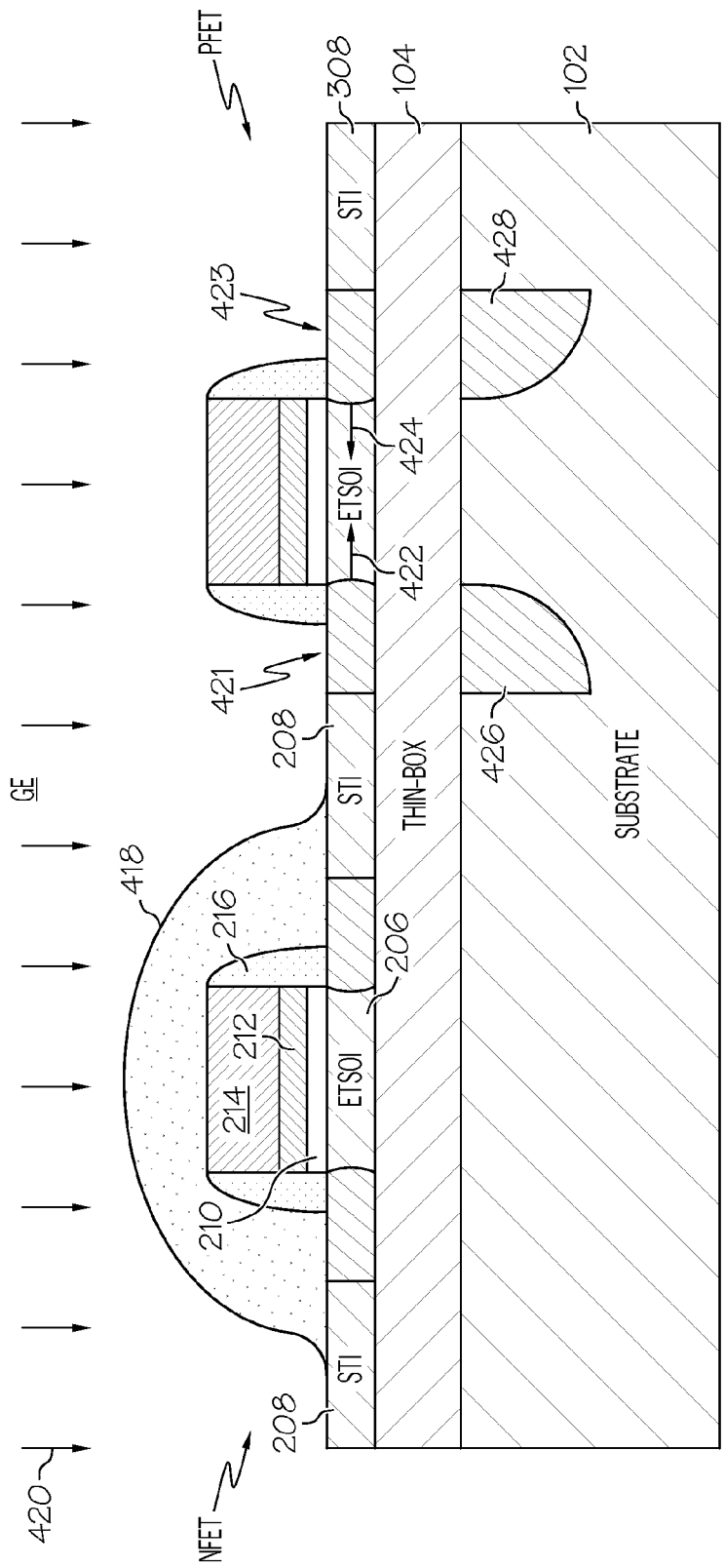

FIG. 4 shows that a mask 418 is formed over the gate stack 210, 212, 214, gate spacer 216, on top of the STI regions 208, and the active region 206 of the NFET device. The mask 418, in one embodiment, comprises a photoresist material. A germanium and/or tin implantation process (indicated by the arrows 420) is performed in order to form amorphized germanium implant regions either within the thin-BOX layer 104 extending into the substrate 102 or entirely within the substrate 102 of the PFET device. During this germanium and/or tin implantation process, the NFET device is protected by the mask 418.

Next, an anneal process (e.g., a laser anneal, flash anneal, rapid thermal anneal, furnace anneal, etc.) is performed so as to re-crystallize the amorphized germanium and/or tin implant regions. Upon re-crystallization, the substitutional germanium and/or tin either present in the thin-BOX layer 104 extending down into the substrate later 102 or present entirely in the substrate layer 102 forms a silicon germanium (Si:Ge), silicon tin (Si:Sn), or silicon germanium tin (SiGe:Sn) alloy that imparts a predetermined stress (e.g., a compressive stress) on the silicon channel region as indicated by the arrows 422, 424. For example, FIG. 4 shows that a silicon-containing alloy (such as Si:Ge, Si:Sn, or Si:Ge:Sn) embedded stressors 426, 428 have been formed below the thin-BOX layer 104 in the substrate layer 102 of the PFET device. In this embodiment there is no appreciable germanium or tin content in the active region of the device. These embedded stressors 426, 428 are substantially aligned with the source/drain regions 430, 432 of the PFET. In one embodiment, the dose of germanium and/or tin used during the implantation process is between $1\times10^{14}$ cm$^{-2}$ and $1\times10^{16}$ cm$^{-2}$ and the energy of Ge or Sn implant is in the range of 20 keV and 100 keV However, other energies and doses are applicable. This germanium and/or tin implantation under the thin-BOX enhances hole mobility in the PFET. In one embodiment the concentration of Ge atoms in the SiGe alloy is between 0 and 30 percent. In another embodiment the Ge concentration is between 5 and 15 percent, although lesser or greater values can be used. In one embodiment the concentration of Sn atoms in the SiSn alloy is between 0 and 10 percent. In another embodiment the concentration of Sn atoms in the SiSn alloy is between 2 and 8 percent, although lesser or greater values can be used. The thin-BOX allows lower energy implants thereby minimizing the effect of channel poisoning and/or amorphization.

It should be noted that embodiments of the present invention are not limited to a vertical implantation process as shown in FIGS. 3 and 4. For example angled implantation can also be performed for forming the Si:C and/or the Si:Ge (or Si:Sn or Si:Ge:Sn) embedded stressors shown in FIGS. 3 and 4. In an embodiment where angled implantation is implemented, the gate spacer 216, 316 of the device shadows the implantation process with respect to the source/drain region based on the angle used. Therefore, when angled implantation is utilized, implantation is performed at a given angle and also at a substantially opposite angle (e.g., 180 degrees off) to ensure a symmetric implantation. This results in an embedded stressor (e.g., a pocket of Si:C, Si:Ge, Si:Sn, or Si:Ge:Sn) being formed partially within the thin-BOX layer 104 extending into the substrate 102 or entirely in the substrate 102 at a position that is substantially aligned with the channel (or gate stack) similar to that shown in FIGS. 7 and 8.

Even further, an NFET device is not limited to having carbon implanted therein. For example, germanium or tin can also be implanted in the NFET device. However, an angled implantation process is performed for implanting the germanium within the NFET device. Also, a PFET device is not limited to having germanium or tin implanted therein. For example, carbon can also be implanted in the PFET device. However, an angled implantation process is performed for implanting the carbon within the PFET device.

Figure 5:
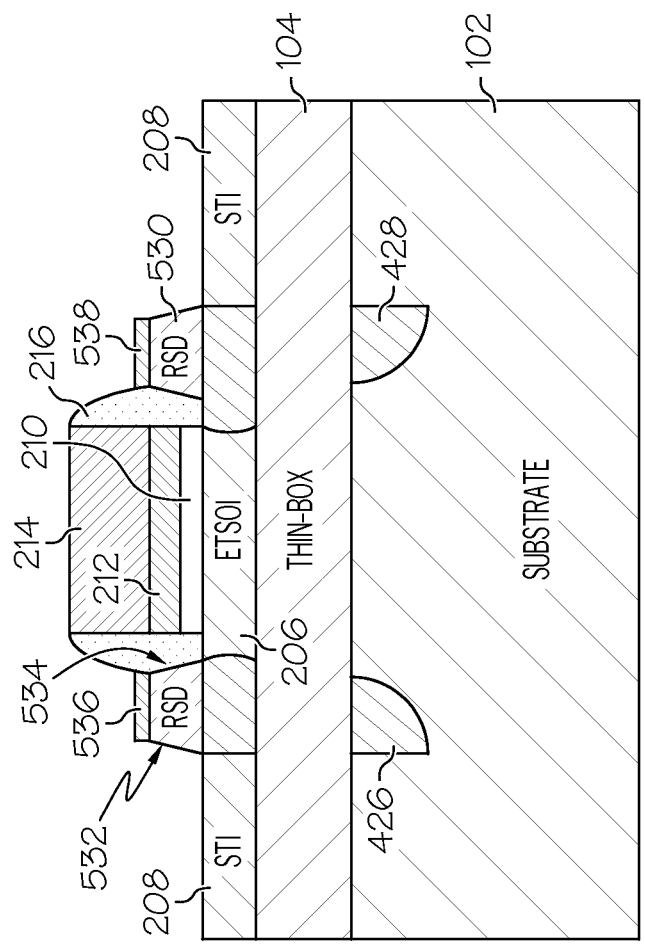

Once the carbon, germanium, and/or tin implantation and subsequent annealing processes have been performed, the mask 318, 418 is removed from the protected device and conventional CMOS processing operations are performed to form raised source/drain regions and complete the fabrication process for the NFET and PFET devices. For example, a faceted raised source/drain 530 can be formed using epitaxy, as shown in FIG. 5. This thickens the silicon area where deep source/drain implantation is to be performed, in order to reduce the transistor series resistance, and increase the transistor on current. To form the faceted raised source/drain 530, an initial pre-cleaning can be performed that exposes the silicon surface of the source/drain areas 221, 223. In this embodiment, the pre-cleaning is performed using an HF wet etch or HF-vapor based chemical oxide removal ("COR").

Next, epitaxy that is selective with respect to oxide (and optionally nitride) is used to form the faceted raised source/drain 530. The faceted raised source/drains 530 comprise in-situ doping (boron, in one embodiment for PFET and phosphorus, in one embodiment, for NFET). It should be noted that, according to one embodiment, raised source/drain 530 may not contain any doping. In the present embodiment, the doping can be performed using any standard approach such as ion implantation. In particular, the growth rates for (100) vs. (110) oriented planes are engineered so that during the epitaxial growth on (100) Si faceted raised/source drains are obtained. As can be seen from FIG. 5, the faceted raised source/drains 530 comprise angled sides 532, 534 rather than completely abutting the gate. Each of the faceted sides 532, 534, in one embodiment, is angled with an angle from 5 degrees to 85 degrees relative to a bottom surface of the faceted raised source/drain region. According to another embodiment, each of the faceted sides 532, 534, is angled with an angle from 40 degrees to 55 degrees relative to a bottom surface of the faceted raised source/drains 530. In another embodiment, the angle for each of the faceted sides 534, 536, is angle substantially less than 90 degrees and substantially greater than zero degrees. Moreover, the angle of one of the faceted sides 532, 534 can be different than the angle of the other one of the faceted sides 532, 534. It should also be noted that, non-faceted (i.e. vertical) epitaxy and/or multiple epitaxy steps can be used to form the raised source/drain structure without limiting the scope of the present invention.

Next, silicide areas 536 and 538 are formed for contacts. In this embodiment, this is achieved by depositing a metal on top of the raised source/drains 530, performing an anneal to form silicide, and then selectively removing the metal but leave the silicide untouched (e.g., through an aqua regia wet etch). In this exemplary embodiment, the metal is nickel, cobalt, titanium, or platinum or a combination thereof. The resulting ETSOI transistor structure is shown in FIG. 5. From this point, conventional fabrication processes are used to form the remainder of the integrated circuit that includes this transistor.

In another embodiment, embedded stressors are formed under the channel regions of the PFET and NFET devices, as compared to under the source/drain regions of the devices as discussed above. In this embodiment, the NFET and PFET devices are formed according to the processes discussed above with respect to FIGS. 1 and 2. However, with respect to the gate, a gate-last process is utilized where a "dummy" or "replacement" gate is formed for both the NFET and the PFET.

Figure 6:
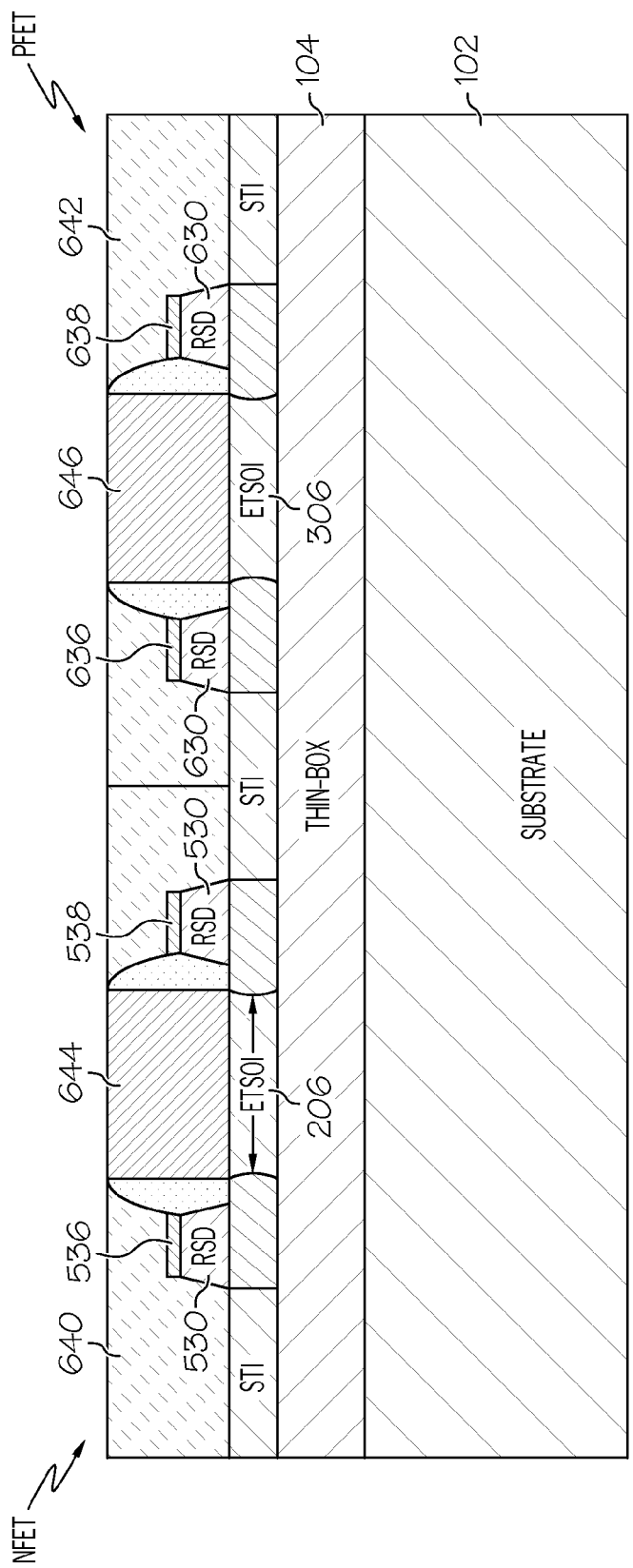
FIGS. 6 to 8 are cross-sectional views of another process for forming a transistor with embedded stressors using ion implantation according to another embodiment of the present invention.

In this embodiment, at least after the silicide areas 536, 538, 636, 638 are formed a dielectric layer 640, 642 is then formed over the raised source/drains 530, 630 and "replacement" gates 644, 646 of the NFET and PFET devices, as shown in FIG. 6. This dielectric layer 640, 642 is then etched down until the "replacement" gate 644, 646. Then the replacement gate 644, 646 of one of the PFET and NFET is removed (forming a gate cavity 748 shown in FIG. 7) via selective etching or other conventional techniques and a mask layer 750 is formed over the "replacement" gate 644 and dielectric layer 640 of the remaining device. When the "replacement" gate 644 of the NFET has been removed a germanium and/or tin implantation process (indicated by the arrows 752) is performed through the gate cavity 748 to form an amorphized germanium and/or tin implant region 754 either within the thin-BOX layer 104 extending into the substrate 102 or entirely within the substrate 102. During this germanium and/or tin implantation process, the PFET device electrode is protected by the mask 750.

Figure 7:
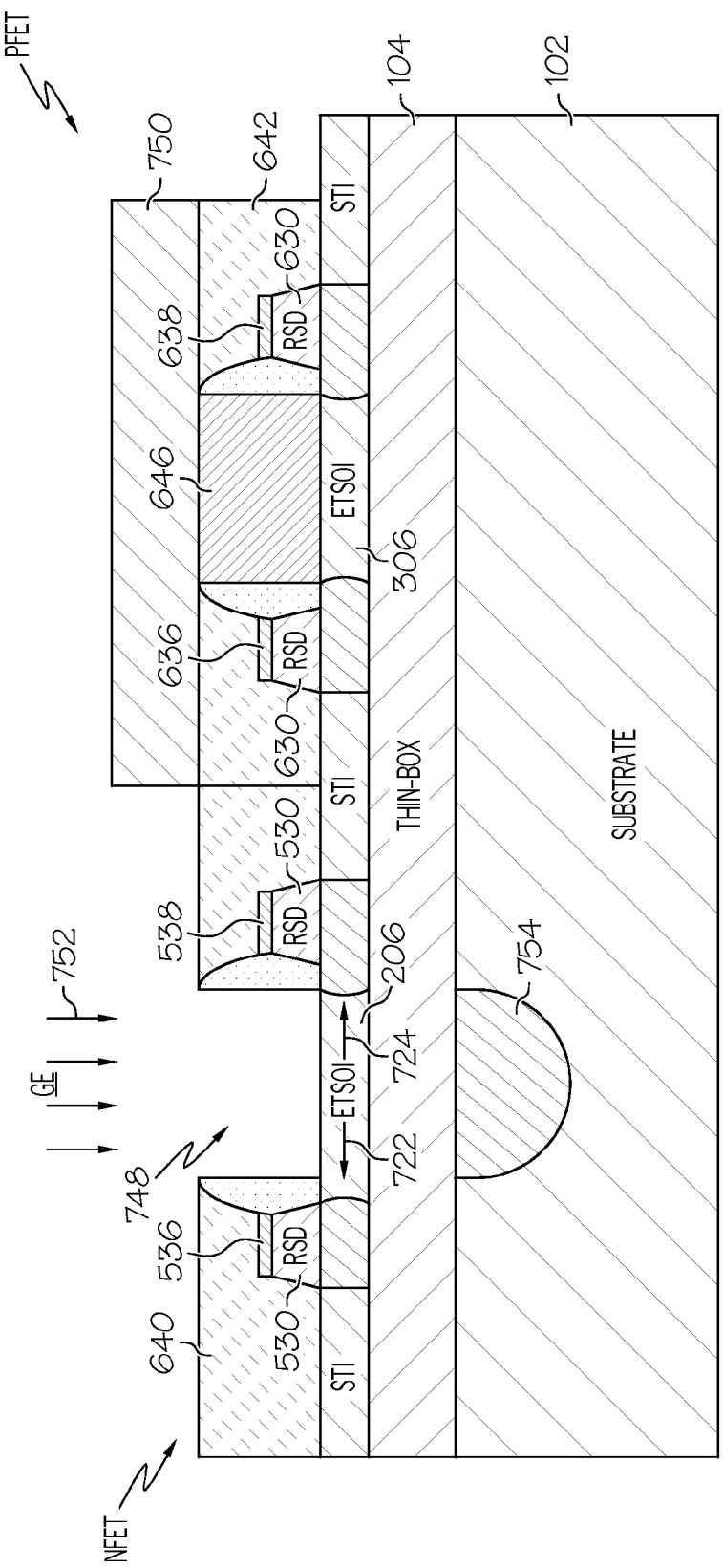

Next, an anneal process (e.g., a laser anneal, flash anneal, rapid thermal anneal, furnace anneal, etc.) is performed so as to re-crystallize the amorphized germanium and/or tin implant region 754. Upon re-crystallization, the substitutional germanium and/or tin present within the germanium and/or tin implant region 754 forms an embedded stressor comprised of silicon germanium, silicon tin, or silicon germanium tin alloy that imparts a predetermined stress (e.g., a compressive stress) on the silicon channel region as indicated by the arrows 722, 724. For example, FIG. 7 shows that a silicon-germanium (Si:Ge), silicon-tin (Si:Sn), or silicon-germanium-tin (Si:Ge:Sn) embedded stressor 754 has have been formed below the thin-BOX layer 104 in the substrate layer 102. These Si:Ge, Si:Sn, or Si:Ge:Sn embedded stressor 754 is substantially aligned with the channel. In one embodiment the concentration of Ge atoms in the SiGe alloy is between 0 and 30 percent. In another embodiment the Ge concentration is between 5 and 15 percent, although lesser or greater values can be used. In one embodiment the concentration of Sn atoms in the SiSn alloy is between 0 and 10 percent. In another embodiment the concentration of Sn atoms in the SiSn alloy is between 2 and 8 percent, although lesser or greater values can be used. Conventional processes are then performed to form the gate stack and complete the fabrication process.

When the "replacement" gate 646 of the PFET has been removed a carbon implantation process (indicated by the arrows 852) is performed through the gate cavity 848 to form an amorphized carbon implant region 854 either within the thin-BOX layer 104 extending into the substrate 102 or entirely within the substrate 102. During this carbon implantation process, the NFET device electrode is protected by the mask 850.

Figure 8:
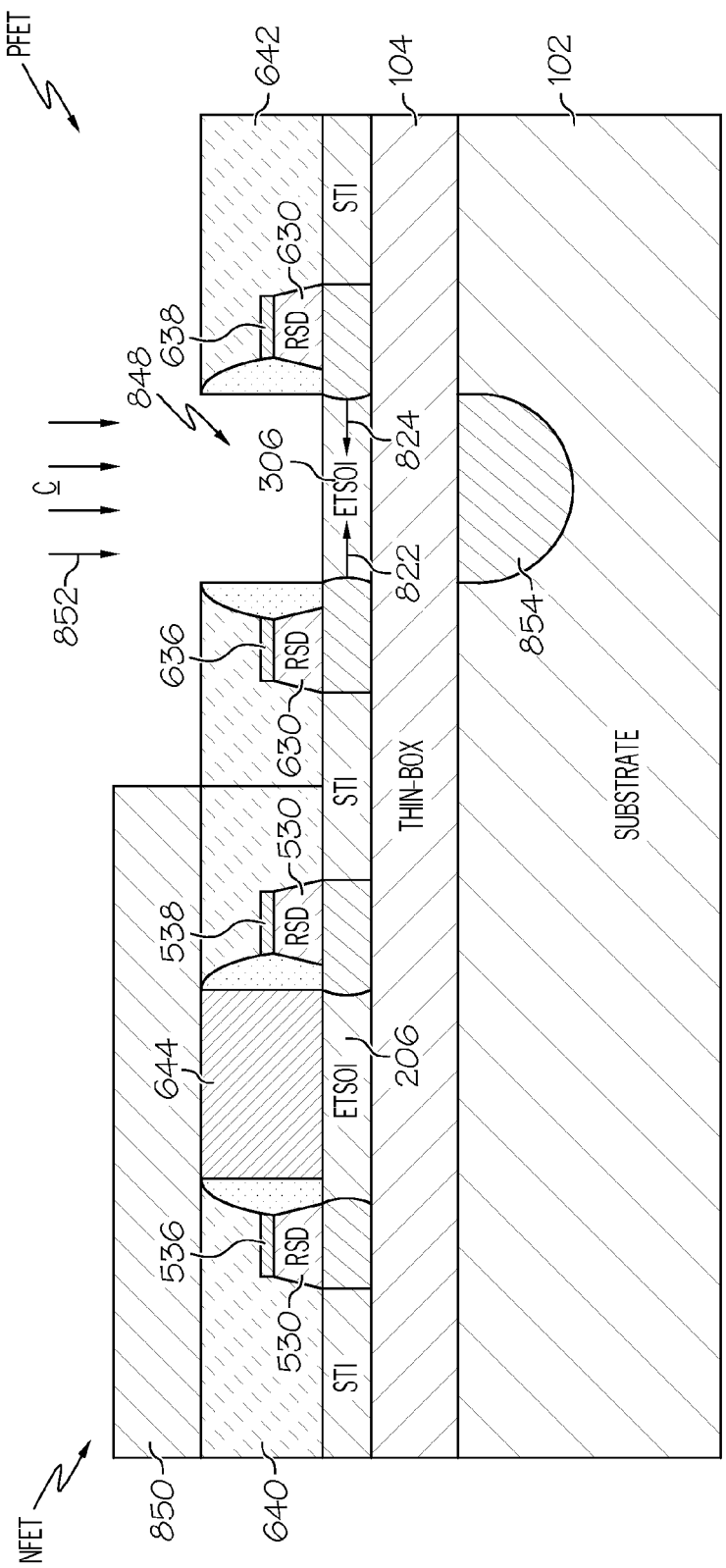

Next, an anneal process (e.g., a laser anneal, flash anneal, rapid thermal anneal, furnace anneal, etc.) is performed so as to re-crystallize the amorphized carbon implant region 854. Upon re-crystallization, the substitutional carbon present within the carbon implant region 854 forms an embedded stressor comprised of silicon carbon alloy that imparts a predetermined stress (e.g., a tensile stress) on the silicon channel region as indicated by the arrows 822, 824. For example, FIG. 8 shows that a silicon-carbon (Si:C) embedded stressor 854 has have been formed below the thin-BOX layer 104 in the substrate layer 102. These Si:C embedded stressor 854 is substantially aligned with the channel (or gate stack after its formation). In one embodiment the concentration of C atoms in the substitutional sites is between 0 and 3 percent. In another embodiment the concentration of C in substitutional sites is between 0.5 and 2 percent, although lesser or greater values can be used. Conventional processes are then performed to form the gate stack and complete the fabrication process.

Figure 9:
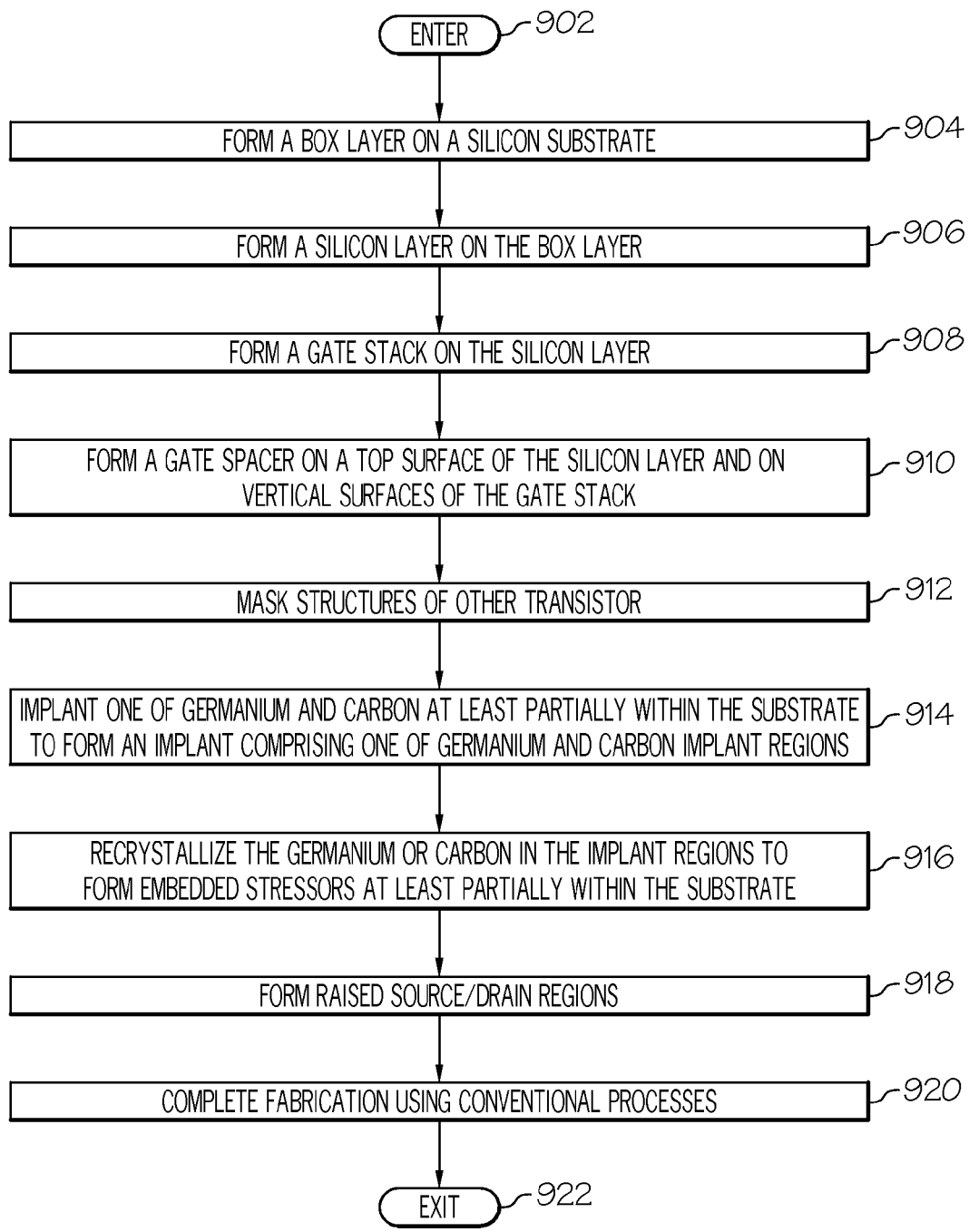
FIGS. 9-10 are operational flow diagrams illustrating various examples of fabricating a transistor device comprising embedded stressors using ion implantation according to various embodiment of the present invention.
Figure 10:
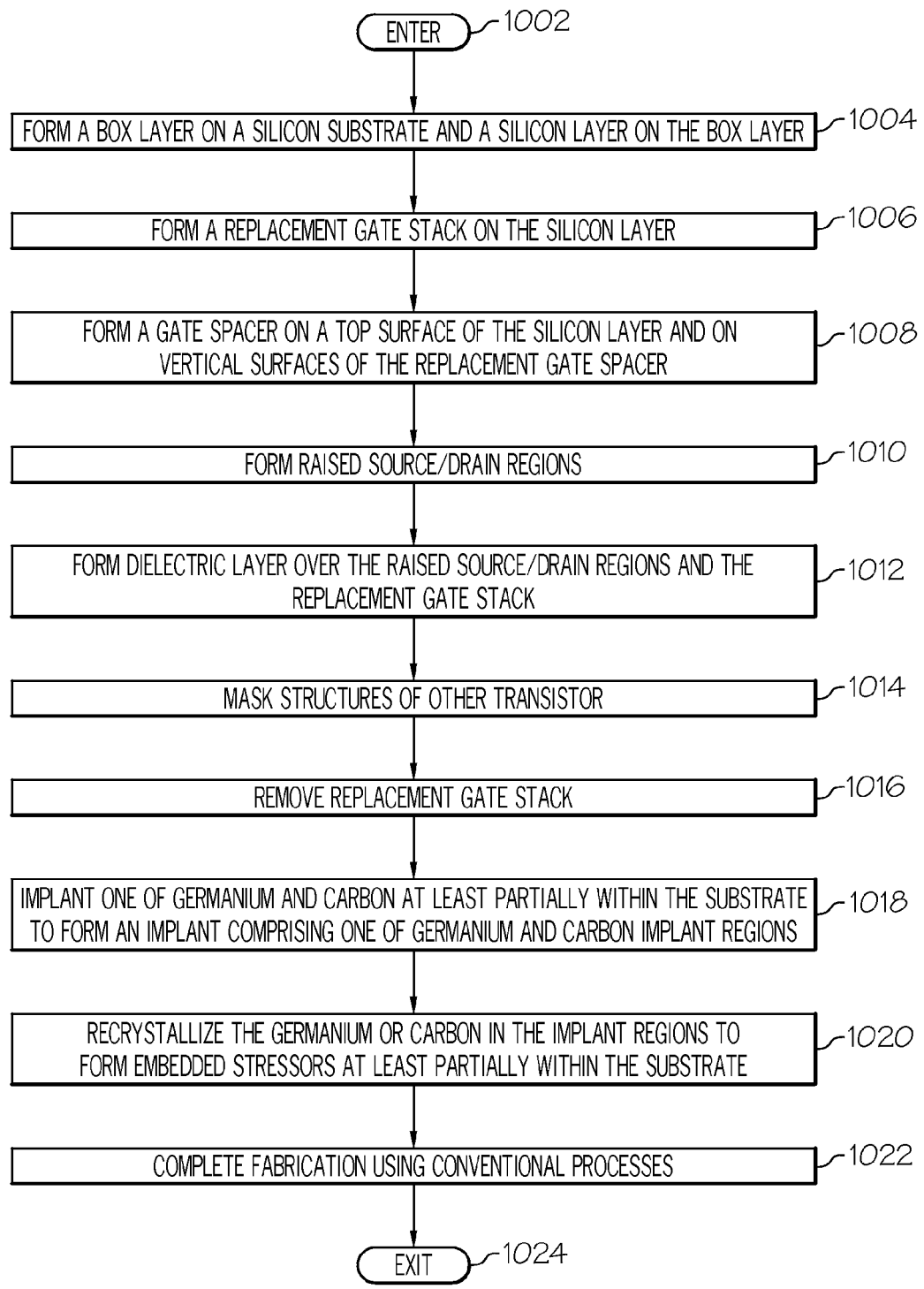

FIGS. 9 and 10 are operational flow diagrams illustrating various processes for forming embedded stressors within UTBB field effect transistors. In FIG. 9, the operational flow diagram beings at step 902 and flows directly to step 904. A BOX layer 104, at step 904, is formed on a silicon substrate 102. The BOX layer 104, in one embodiment, is formed with a thickness that is less than 50 nm. An ETSOI layer 106, at step 906, is formed on the BOX layer 104. A gate stack 210, 212, 214, at step 908, is formed on the silicon layer 106. A gate spacer 216, at step 910, is formed on a top surface of the ETSOI layer 106 and on vertical surfaces on the gate stack 214. A mask 318, at step 912, is deposited on the other transistor, as discussed above.

An implantation process, at step 914, is performed to implant one of germanium, tin, and carbon either entirely within the silicon substrate 102 or partially within the silicon substrate 102 to form implant regions that are substantially aligned with source/drain regions 221, 223. The germanium, tin, or carbon within the implant regions, at step 916, is then recrystallized to form embedded stressors 326, 328 either entirely within the silicon substrate 102 or partially within the silicon substrate 102. Raised source/drain regions 530, at step 918, are then formed. Conventional processes, at step 920, are then performed to complete the fabrication process. The control then exits at step 922.

In FIG. 10, the operational flow diagram beings at step 1002 and flows directly to step 1004. A BOX layer 104 is formed on a silicon substrate 102 and an ETSOI layer 106 is formed on the BOX layer 104, at step 1004. The BOX layer 104, in one embodiment, is formed with a thickness that is less than 50 nm. A replacement gate stack 644, at step 1006, is formed on the silicon layer 106. A gate spacer 216, at step 1008, is formed on a top surface of the ETSOI layer 106 and on vertical surfaces on the replacement gate stack 644. Raised source/drain regions 530, at step 1010, are then formed.

A dielectric layer 640, at step 1012, is formed over the raised source/drain regions 530 and the replacement gate stack 644. A mask 750, at step 1014, is deposited on the other transistor, as discussed above. The replacement gate stack 640, at step 1016, is then removed. An implantation process, at step 1018, is performed to implant one of germanium, tin, and carbon either entirely within the silicon substrate 102 or partially within the silicon substrate 102 to form implant regions that are substantially aligned with the silicon channel in the ETSOI layer 106. The germanium, tin, or carbon within the implant regions, at step 1020, is then recrystallized to form embedded stressors 754 either entirely within the silicon substrate 102 or partially within the silicon substrate 102. Conventional processes, at step 1022, are then performed to complete the fabrication process. The control then exits at step 1024.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating an extremely-thin-silicon-on-insulator transistor, the method comprising:
    forming a buried oxide layer on a silicon substrate;
    forming a silicon layer on the buried oxide layer;
    forming a gate stack on the silicon layer that is above the buried oxide layer;
    forming a gate spacer on the silicon layer and on sidewalls of the gate stack;
    epitaxially forming a first raised source/drain region and a second raised source/drain region each adjacent to the gate spacer; and
    forming at least one embedded stressor at least partially within the substrate that imparts a predetermined stress on a silicon channel region formed within the silicon layer, wherein the at least one embedded stressor is substantially aligned with at least one of the gate stack, and one or more of the first and second raised source/drain regions.

2. The method of claim 1, wherein the at least one embedded stressor is formed after the gate stack is formed with a gate dielectric on the silicon layer and a gate conductor on the gate dielectric, and prior to forming the first and second raised source/drain regions, wherein forming the at least one embedded stressor comprises:
    forming at least one amorphized implant region at least partially within the substrate, wherein the at least one amorphized implant region comprises one of implanted germanium, implanted tin, and implanted carbon; and
    recrystallizing the one of implanted germanium, implanted tin, and implanted carbon of the at least one amorphized implant region, the recrystallizing forming one of a silicon-germanium alloy, silicon-tin, or silicon-germanium-tin and a silicon-carbon alloy, respectively.

3. The method of claim 2, wherein the at least one amorphized implant region is formed by one of a vertical implantation process and an angled implantation process.

4. The method of claim 1, wherein the gate stack is a replacement gate stack, and wherein forming the at least one embedded stressor comprises:
    forming a dielectric layer on the first and second raised source/drain regions, the gate spacer, and the replacement gate stack;
    removing the replacement gate stack exposing a portion of a top surface of the silicon layer between a first vertical wall and a second vertical wall of the gate spacer;
    implanting one of germanium, tin, and carbon at least partially within the substrate through the portion of the top surface of the silicon layer, the implanting forming at least one amorphized implant region at least partially within the substrate comprising the one of germanium, tin, and carbon; and
    recrystallizing the one of germanium, tin, and carbon that has been implanted at least partially within the substrate, the recrystallizing forming one of a silicon-germanium alloy, silicon-tin, or silicon-germanium-tin and a silicon-carbon alloy, respectively.

5. The method of claim 1, further comprising:
masking at least a gate stack and a silicon layer formed on the buried oxide layer of a corresponding transistor device as the at least one embedded stressor is being formed.

6. The method of claim 1, wherein the buried oxide layer is formed with a thickness that is less than 50 nm.

7. The method of claim 1, wherein the silicon layer is formed with a thickness ranging from 2 nm-15 nm.

8. The method of claim 1, wherein the at least one embedded stressor comprises a first embedded stressor substantially aligned with the first raised source/drain region and a second embedded stressor substantially aligned with the second raised source/drain region.

9. The method of claim 1, wherein the at least one embedded stressor is substantially aligned with the gate stack.

* * * * *